United States Patent [19]

Fang et al.

[11] Patent Number: 4,485,353

[45] Date of Patent: Nov. 27, 1984

[54] PLL OSCILLATOR SYNCHRONIZING SYSTEM WITH MATRIX FOR PHASE CORRECTION

[75] Inventors: Ta-Fang Fang, Belle Mead; Erwin J. Wittmann, North Plainfield; Leopold A. Harwood; Jack Craft, both of Bridgewater, all of N.J.

[73] Assignee: RCA Corporation, New York, N.Y.

[21] Appl. No.: 383,263

[22] Filed: May 28, 1982

[51] Int. Cl.$^3$ .............................................. H03L 7/08
[52] U.S. Cl. ......................................... 331/8; 331/17; 331/20; 331/25; 358/19
[58] Field of Search .......................... 331/8, 17, 20, 25; 358/19

[56] References Cited

U.S. PATENT DOCUMENTS

| | | | |
|---|---|---|---|
| 3,763,439 | 10/1973 | Peil | 331/20 X |
| 4,020,500 | 4/1977 | Harwood | 358/19 |
| 4,095,255 | 6/1978 | Groeneweg et al. | 358/17 |
| 4,249,199 | 2/1981 | Harwood et al. | 358/19 |
| 4,263,608 | 4/1981 | Hinn | 358/19 X |

Primary Examiner—Eugene R. Laroche
Assistant Examiner—D. C. Mis
Attorney, Agent, or Firm—Eugene M. Whitacre; Paul J. Rasmussen; William H. Meagher

[57] ABSTRACT

Color reference oscillator in a color television receiver comprises a non-inverting amplifier, with positive feedback from its output conveyed via a crystal filter to its input. A quadrature phase shift network, coupled to the filter output, develops phase shifted signals which are matrixed with signals derived directly from the non-inverting amplifier to form resultant signals with a phase intermediate the phases of the matrix inputs. Control voltage outputs of a phase comparator, responsive to oscillator signals and to received synchronizing bursts, determine the magnitude and polarity of the output of a controlled amplifier which has at its input the resultant signals produced by said matrixing. The controlled amplifier output, and the output of an inverting amplifier also responsive to said resultant signals, share the load resistor of the non-inverting amplifier. Matrixing parameters and magnitude of inverting amplifier output are selected to eliminate adverse effects of undesired phase lag associated with the load circuit of the non-inverting amplifier.

6 Claims, 1 Drawing Figure

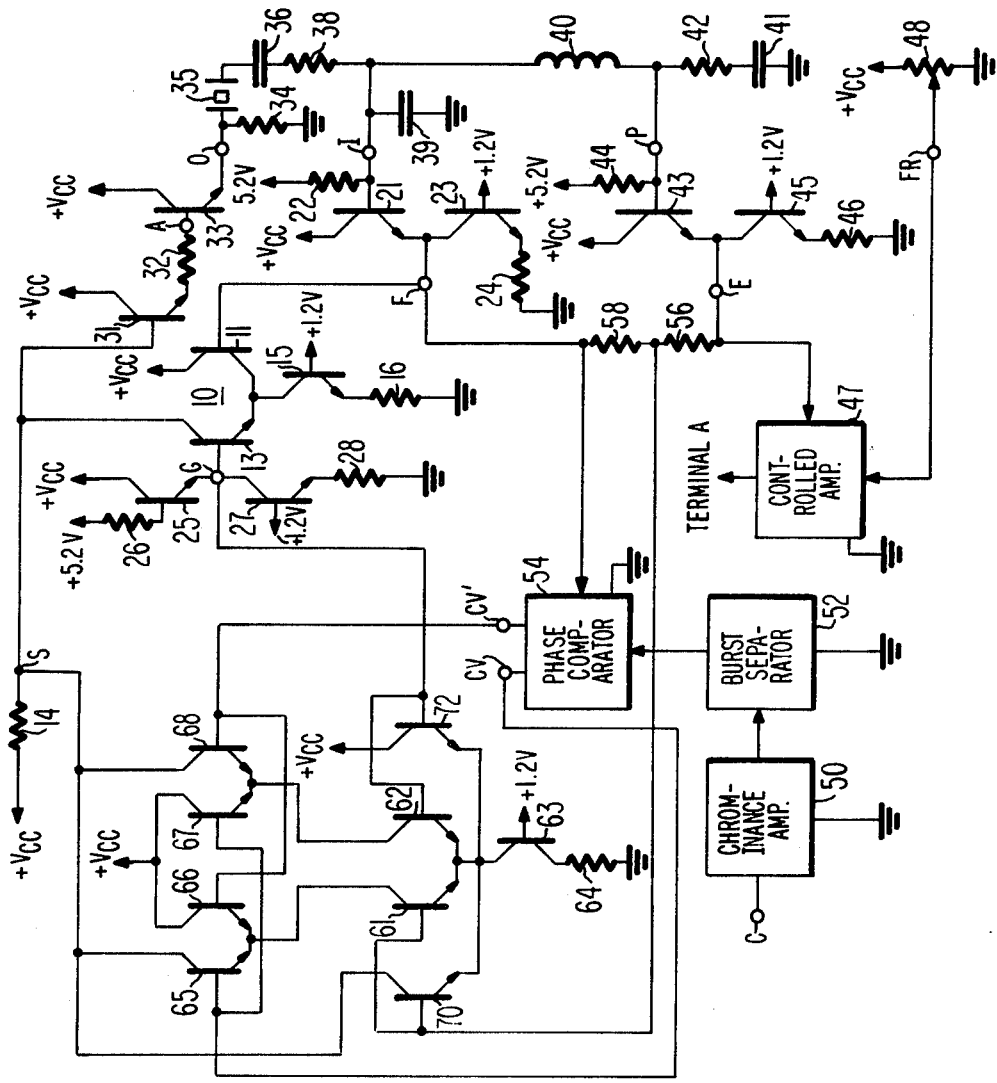

PLL OSCILLATOR SYNCHRONIZING SYSTEM WITH MATRIX FOR PHASE CORRECTION

The present invention relates generally to phase locked loop (PLL) oscillator synchronizing systems, and particularly to a novel form of PLL oscillator synchronizing system incorporating compensation for adverse effects of parasitic capacitance in an advantageous manner permitting attainment of a symmetrical phase control characteristic for use in synchronization of the oscillator with external reference oscillations.

U.S. Pat. No. 4,020,500—Harwood discloses a synchronized oscillator of a general type which has been subject to widespread use as the color reference oscillator in color television receivers. The oscillator employs a non-inverting amplifier, with feedback via a crystal filter linking the output and input of the non-inverting amplifier. A quadrature phase shift network coupled to the filter output supplies phase shifted signals to an additional controlled amplifier. A phase detector, responsive to received color synchronizing bursts of reference oscillations and to signals from the non-inverting amplifier, develops control voltages representative of the magnitude and sense of the difference, if any, from a desired quadrature phase relationship between its inputs. The additional controlled amplifier supplies phase shifted signals to the non-inverting amplifier's load of a polarity and magnitude determined by the control voltages so as to minimize the aforesaid difference.

In an integrated circuit realization of the circuitry shown in the aforesaid U.S. Pat. No. 4,020,500, unwanted phase shift may be associated with the load shared by the non-inverting amplifier and the controlled amplifier of phase shifted signals, due to the cumulative effect of parasitic capacitances appearing at the respective collector electrodes of the plurality of transistors coupled to the shared load. Without suitable compensation therefor, such phase shift can interfere with attainment of optimum tuning of the oscillator's free-running frequency, and can introduce undesired asymmetry to the phase control characteristic employed for synchronization purposes. U.S. Pat. No., 4,095,255 discloses a cascode technique effecting isolation of the collector electrodes of the controlled amplifier from the shared load that lessens the aforementioned unwanted phase shift. U.S. Pat. No. 4,249,199 discloses a phase shift compensation technique which can satisfactorily eliminate adverse effects of the aforementioned undesired phase shift on the ability to attain proper tuning of the oscillator's free-running frequency.

The present invention is directed to an improvement over the arrangement disclosed in the aforesaid U.S. Pat. No. 4,249,199, which ensures attainment of symmetry of the phase control characteristic for the controlled oscillator, as well as elimination of the adverse effects on the ability to attain proper tuning of the free-running frequency.

In accordance with an illustrative embodiment of the present invention, the output of the quadrature phase shift network in an oscillator synchronizing system of the general type shown in the aforementioned U.S. Pat. No. 4,020,500 is matrixed with signals directly derived from the non-inverting amplifier thereof to form resultant signals of a phase intermediate the phases of the respective matrixed signals. These resultant signals are subject to an amplification which is controlled in a manner determined by the phase comparator's control voltage output, with the sense of the difference from the desired quadrature phase relationship between the comparator's input determining whether the amplification is accompanied by phase inversion or not and with the magnitude of the difference determining the degree of amplification. The controlled amplifier shares the load resistor of the ocillator's non-inverting amplifier. An additional inverting amplifier is also responsive to the resultant signals produced by the aforesaid matrixing and develops a phase inverted version of the resultant signals of substantially fixed magnitude across the shared load resistor.

The matrixing parameters and the gain of the inverting amplifier are chosen in relation to the undesired phase shift associated with the shared load resistor so that: (1) the combination of (a) the signals developed across the shared load resistor by the inverting amplifier, and (b) the signals developed across the shared load resistor by the non-inverting amplifier, comprises signals which are substantially in phase with the signals appearing at the input of the non-inverting amplifier; and (2) the effect of the undesired phase shift associated with the shared load resistor on the output of the controlled amplifier developed thereacross is to place the phase thereof substantially in quadrature with the phase of the aforesaid combination.

Illustratively, the controlled amplifier includes first and second transistors disposed with interconnected emitter electrodes connected to a common current source. The base electrode of the first transistor is responsive to the resultant signals formed by the aforementioned matrixing, while the base electrode of the second transistor is maintained at a predetermined bias potential. First and second amplifying means have signal inputs coupled respectively to the collector electrodes of the first and second transistors, are provided with interconnected outputs, and are subject to differential gain control in accordance with the phase comparator's control voltage output.

The inverting amplifier illustratively comprises a third transistor having its base-emitter path in shunt with the base-emitter path of the first transistor, and its collector electrode coupled to the shared load resistor. To preserve symmetry of operation of the controlled amplifier in the instance of such a circuit arrangement for the inverting amplifier (i.e., wherein it shares a current source with the controlled amplifier), a fourth transistor is desirably disposed with its base-emitter path in shunt with the base-emitter path of the second transistor, and with its collector electrode connected to a supply terminal of fixed potential.

In the accompanying drawing, the sole FIGURE illustrates, partially schematically and partially block representation, a portion of a color television receiver incorporating a color reference oscillator of a voltage controlled form in a PLL oscillator synchronizing system in accordance with an embodiment of the present invention.

In the color television receiver portion illustrated in the drawing, a non-inverting amplifier 10 is provided with sufficient positive feedback via a bandpass filter linking its output and input to enable it to operate as an oscillator at an operating frequency lying within the filter's passband.

Amplifier 10 includes a pair of NPN transistors 11 and 13, disposed in a differential amplifier configuration with their emitter electrodes interconnected. The collector electrode of the input transistor (11) of the differential amplifier is directly connected to the positive terminal (+Vcc) of an operating potential supply, while the collector electrode of the output transistor (13) of the differential amplifier is connected to the +Vcc terminal via a load resistor 14. The interconnected emitter electrodes of transistors 11 and 13 are returned to the negative terminal (e.g., ground) of the operating potential supply via the collector-emitter path of an NPN current source transistor 15 in series with its emitter resistor 16.

Signals are applied from the amplifier input terminal I to the base electrode of the input transistor 11 via the base-emitter path of an NPN emitter-follower transistor 21. Signals are applied from the collector (at terminal S) of output transistor 13 to the amplifier output terminal O via the base-emitter paths of a pair of NPN emitter-follower transistors 31 and 33, which are interconnected by a resistor 32 linking emitter electrode of transistor 31 to the base electrode of transistor 33. The emitter electrode of transistor 33 is returned to ground via resistor 34. The collector electrodes of emitter-follower transistors 21, 31, 33 are each directly connected to the +Vcc supply terminal.

Bias for the base electrode of output transistor 13 is established by an NPN emitter-follower transistor 25, disposed with its collector electrode directly connected to the +Vcc supply terminal, with its base electrode connected via a resistor 26 to the positive terminal (+5.2 V.) of a bias supply, and with its emitter electrode directly connected to the base electrode of output transistor 13. The quiescent current drawn by emitter-follower transistor 25 is determined by an NPN current source transistor 27, disposed with its collector electrode directly connected to the emitter electrode of transistor 25 and its emitter electrode returned to ground via resistor 28. The quiescent current drawn by the emitter-follower transistor 21 at the amplifier input is similarly determined by an NPN current source transistor 23, disposed with its collector electrode directly connected to the emitter electrode of transistor 21 and its emitter electrode returned to ground via resistor 24. A resistor 22 couples the base electrode of transistor 21 to the +5.2 V. bias supply terminal. The base electrodes of current source transistors 15, 23 and 27 are each directly connected to the positive terminal (+1.2 V.) of an additional bias supply.

Amplifier output terminal O is linked to the amplifier input terminal I by the series combination of a piezoelectric crystal 35, a fixed capacitor 36, and a resistor 38. Illustratively, crystal 35 is cut so as to exhibit series resonance at a frequency in the immediate vicinity of, but slightly below, the color subcarrier frequency (e.g., 3.579545 MHz.) of the color television signals to which the receiver responds. Accordingly, crystal 35 appears inductive at the color subcarrier frequency. The value of the fixed capacitor 36 is chosen so that the series combination of elements 35 and 36 nominally exhibits series resonance at the color subcarrier frequency, with the Q of the resonant system determined by the resistance value of the series resistor 38 to establish a suitable bandwidth (e.g., 1000 Hz.) for the bandpass filter characteristic of the feedback path. A capacitor 39, coupled between terminal I and ground, cooperates with resistor 38 to provide significant attenuation for harmonics of the desired operation frequency to substantially preclude the sustaining of oscillations at such higher frequencies. The bandpass characteristic provided by elements 35 and 36 allows positive feedback of an oscillation-sustaining magnitude in the immediate vicinity of the color subcarrier frequency. A precise match of the free-running operating frequency to the color subcarrier frequency may not be assured, however, because of practical tolerances associated with elements 35 and 36. As will be subsequently described, the system of the drawing includes additional apparatus permitting adjustment of the free-running operating frequency to a desired precise frequency.

For the purpose of synchronizing the above-described oscillator in frequency and phase with a color subcarrier reference of incoming color television signals, the system of the drawing includes a phase comparator 54. The local input to phase comparator 54 comprises oscillations derived from terminal F at the base electrode of input transistor 11. A chrominance amplifier 50 is responsive to the chrominance component of incoming signals, appearing at terminal C and inclusive of periodic synchronizing bursts of oscillations of color subcarrier frequency and a reference phase. An output of chrominance amplifier 50 is supplied to a burst separator 52, which delivers separated color synchronizing bursts to the other input of phase comparator 54.

Phase comparator 54 functions to develop a control voltage output having a magnitude and polarity indicative of the magnitude and sense of whatever departure from a quadrature phase difference may exist between the respective comparator inputs. Illustratively, phase comparator 54 is of the type developing push-pull outputs, providing complementary control voltages at respective output terminals CV and CV'. These control voltages are used to control the operation of a phase shifted signal amplifier which shares load resistor 14 with the non-inverting amplifier 10.

Phase shifted signals are derived from the output terminal (P) of a phase shifter 40, 42, 41. The phase shifter includes an inductor 40 connected between the amplifier input terminal I and the phase shifter output terminal P, and the series combination of resistor 42 and capacitor 41 connected between terminal P and ground. The values of the phase shifter elements are chosen so that a lagging phase shift (equal to substantially 90° at the color subcarrier frequency) is imparted to oscillations supplied from terminal I. The phase shifted oscillations appearing at the phase shifter output terminal P are coupled to a matrix input terminal E via the base-emitter path of an NPN emitter-follower transistor 43, disposed with its collector electrode directly connected to the +Vcc terminal, with its base electrode directly connected to terminal P and with its emitter electrode directly connected to terminal E. The quiescent current drawn by transistor 43 is determined by an NPN current source transistor 45, disposed with its collector electrode directly connected to terminal E, with its base electrode directly connected to the +1.2 V. bias supply terminal and with its emitter electrode connected to ground via resistor 46.

A controlled amplifier, responsive to the control outputs of comparator 54, includes a pair of NPN transistors 61 and 62, which are disposed as a differential amplifier with interconnected emitter electrodes returned to ground via the collector-emitter path of NPN current source transistor 63 in series with its emitter resistor 64. The base electrode of transistor 63 is directly connected to the +1.2 V. bias supply terminal. Phase shifted signals from terminal E are applied to the base electrode of transistor 61 via a matrixing resistor 56. Signals from terminal F, at the input of the non-inverting amplifier 10, are also applied to the base electrode of transistor 61 via a matrixing resistor 58. Bias is applied to the base electrode of transistor 62 from terminal G (at the base of transistor 13).

The collector electrode of transistor 61 supplies an inverted version of the matrixed signals appearing at the base electrode of transistor 61 to the interconnected emitter electrodes of NPN transistors 65 and 66 via a direct connection thereto. The collector electrode of transistor 62 supplies a non-inverted version of the matrixed signals appearing at the base electrode of transistor 61 to the interconnected emitter electrodes of NPN transistors 67 and 68 via a direct connection thereto. The control potential output appearing at output terminal CV of the phase comparator 54 is supplied to the base electrodes of transistors 65 and 67, while the complementarily varying control potential output appearing at output terminal CV' is supplied to the base electrodes of transistors 66 and 68.

The collector electrodes of transistors 66 and 67 are directly connected to the +Vcc supply terminal, while the collector electrodes of transistors 65 and 68 are directly connected to the collector electrode of transistor 13 so as to develop outputs across the shared load resistor 14. Also developing an output across resistor 14 is an additional NPN transistor 70, disposed with its base-emitter path directly in shunt with the base-emitter path of the differential amplifier transistor 61, and with its collector electrode directly connected to terminal S. The base-emitter path of differential amplifier transistor 62 is directly shunted by the base-emitter path of a further NPN transistor 72, which is disposed with its collector electrode directly connected to the +Vcc supply terminal.

In operation, when a color signal is being received, a departure of one sense from a desired quadrature phase relationship between the received synchronizing bursts and oscillations from terminal F unbalances the control voltages at terminals CV and CV' in a direction elevating the potential at the base electrodes of transistors 65 and 67, while depressing the potential at the base electrodes of transistors 66 and 68. Under such circumstances, the magnitude of an inverted version of the controlled amplifier input passed by transistor 65 exceeds the magnitude of a non-inverted version thereof passed by transistor 68. Conversely, a departure of the opposite sense from the desired quadrature phase relationship unbalances the control voltages in the opposite direction, whereby the magnitude of the non-inverted version passed by transistor 68 exceeds the magnitude of the inverted version passed by transistor 65. In each instance, the consequent injection of phase-shifted signals into the oscillator loop alters the oscillator's frequency in the particular direction appropriate to reduce the departure from the desired quadrature phase difference between comparator inputs so as to effect the desired synchronization.

It will be noted that the sharing of load resistor 14 by the non-inverting amplifier 10 and the controlled amplifier of phase shifted signals results in a plurality of collector electrodes being directly connected thereto. Load resistor 14 is thus effectively shunted by parasitic capacitances associated with each collector, which, in aggregate, result in introduction of an undesired lagging phase shift of sufficient magnitude to pose tuning range and/or phase control asymmetry problems that require correction if optimum performance is desired.

The matrixing of signals from terminals E and F to form the signal input for the controlled amplifier is part of the correction technique of the present invention. The ratio of resistance values for the matrixing resistors 56 and 58 is selected so that the resultant of matrixing is shifted in phase in the leading direction, relative to the phase of the quadrature phased signal at terminal E, with the magnitude of phase shift in the leading direction substantially matching the magnitude of lagging phase shift associated with the load circuit of non-inverting amplifier 10. Additionally, the magnitude of the inverted version of the matrixing resultant, which is injected by the inverting amplifier 70 into the shared load, is selected so that the vector sum of (a) such injected signals and (b) the signal components delivered to the shared load by the non-inverting amplifier's output transistor 13, comprises signals substantially identical in phase with the signals appearing at the base of the non-inverting amplifier's input transistor 11.

By virtue of the above-described injection of compensating signals from inverting amplifier 70, the phase lag associated with the load circuit of the non-inverting amplifier 10 has substantially no effect on the free-running operation of the oscillator. For symmetry of phase control action for the synchronizing loop, however, compensation for the effect of the phase lag associated with the shared load on the controlled amplifier's output must additionally be provided, and such compensation is provided through the lead introduction effected for the controlled amplifier's input by the matrix 56, 58. The net effect of this lead introduction and the lag associated with the shared load is that the injected components from the controlled amplifier will bear either a lagging quadrature relationship or a leading quadrature relationship (as appropriate to the adjustment required for synchronization) to the (continuously present) resultant of the contributions from transistors 70 and 13, whereby symmetry of control action is assured.

In the specific arrangement shown in the drawing, the inverting amplifier transistor 70 shares a current source (transistor 63) with the differential amplifier formed by transistors 61 and 62. Symmetry of operation of the differential amplifier is preserved, in the presence of such current source sharing, by the addition of transistor 72 (desirably matched in structure to transistor 70) to additionally share the common current source, while entrained (by virtue of its base connection to the base of transistor 62) to vary its current in a manner complementary to the variations of current drawn by transistor 70. Attainment of the proper magnitude of compensating signal injection by transistor 70 is readily achieved by selection of appropriate emitter dimensions therefor (with transistor 72 suitably matched therewith).

As previously mentioned, it is desirable in systems of the illustrated type to provide a facility for adjustment of the free-running frequency of the color reference oscillator, so that it may be set precisely to a desired color subcarrier frequency. One known technique for providing such a facility is employment of a variable capacitor in the oscillator's feedback filter, as shown, for example, in the aforementioned U.S. Pat. No. 4,020,500.

In the system illustrated in the accompanying drawing, however, a different technique (explained in detail in the copending U.S. patent application Ser. No. 383,303, of R. Shanley, et al., entitled "PLL Oscillator Synchronizing System With DC Control Of Free-Running Frequency" and filed concurrently herewith) is employed. Phase shifted signals from terminal E are applied as the signal input to an additional controlled amplifier 47, the output of which is coupled to terminal A at the base electrode of the output emitter-follower transistor 33 of the oscillator. An adjustable DC voltage from the movable tap of a potentiometer 48 (with fixed end terminals connected respectively to the +Vcc supply terminal, and to ground) is supplied to the control input terminal FR of amplifier 47. Amplifier 47 injects into the oscillator loop phase shifted signals of a magnitude and polarity dependent upon the magnitude and sense of the departure of the potentiometer's tap position from a balance setting. The injected component is a leading quadrature component when upward adjustment from the free-running frequency of the balance setting is desired, and a lagging quadrature component when downward adjustment from the free-running frequency of the balance setting is desired.

What is claimed is:

1. A phase locked loop oscillator synchronizing system comprising the combination of:
    (1) an oscillator including:
        (a) a non-inverting signal amplifier having an input terminal, and an output terminal; and
        (b) a band pass filter electrically coupled between said output terminal and said input terminal of said non-inverting amplifier to provide said non-inverting amplifier with a path for positive feedback permitting the development by said oscillator of oscillations at a frequency within the pass band of said filter;
    (2) a phase shifter having an input terminal electrically coupled to receive said oscillations developed by said oscillator and having an output terminal at which phase shifted oscillations appear;
    (3) a phase comparator, having a first input terminal electrically coupled to receive a signal comprising oscillations developed by said oscillator, and a second input terminal electrically coupled to receive a reference oscillatory signal, said phase comparator developing a control voltage having an amplitude and polarity indicative of the magnitude and sense of the departure, if any, from a quadrature phase relationship between the respective signals appearing at its input terminals;
    (4) means for matrixing said phase shifted oscillations appearing at the output terminal of said phase shifter with oscillations derived directly from said non-inverting amplifier to form a matrix output signal exhibiting a phase intermediate the phases of said phase shifted oscillations and said directly derived oscillations;
    (5) an inverting amplifier, responsive to said matrix output signal for developing a phase-inverted version of said matrix output signal of a substantially fixed magnitude;
    (6) controlled amplifier means, responsive to said matrix output signal and to said control voltage, for subjecting said matrix output signal to amplification with inversion when a departure of one sense occurs between the respective signals appearing at the input terminals of said phase comparator, and for subjecting said matrix output signal to amplification without inversion when a departure of the opposite sense occurs between the respective signals appearing at the input terminals of said phase comparator, with the degree of said amplification of said matrix output signal by said controlled amplifier means being dependent upon the magnitude of said departure from said quadrature phase relationship; and
    (7) means for combining the respective outputs of said inverting amplifier and said controlled amplifier means with the output of said non-inverting amplifier.

2. Apparatus in accordance with claim 1 wherein said phase shifter introduces a phase lag substantially equal to 90° at the operating frequency of said oscillator.

3. Apparatus in accordance with claim 2 wherein said combining means comprises a load resistor shared by said non-inverting amplifier, said inverting amplifier, and said controlled amplifier means; wherein stray capacitance associated with said load resistor imparts a phase lag to the output of said non-inverting amplifier; and wherein the parameters of said matrixing means and the gain of said inverting amplifier are such that (1) the combination of (a) said inverted version of said matrix output signal developed by said inverting amplifier, and (b) the output of said non-inverting amplifier, comprises signals of substantially the same phase as the oscillations appearing at said input terminal of said non-inverting amplifier; whereas (2) the phase of the output of said controlled amplifier means bears a substantially quadrature phase relation to the phase of said oscillations appearing at said input terminal of said non-inverting amplifier.

4. Apparatus in accordance with claims 1 or 3, wherein said controlled amplifier means includes:
    first and second transistors disposed with emitter electrodes electrically connected to each other;
    a current source electrically coupled to said emitter electrodes;
    means for rendering the base electrode of said first transistor responsive to the output of said matrixing means;
    means for maintaining the base electrode of said second transistor at a predetermined bias potential;
    first amplifying means having a signal input electrically coupled to the collector electrode of said first transistor;
    second amplifying means having a signal input electrically coupled to the collector electrode of said second transistor;
    means, responsive to the control voltage output of said phase comparator, for differentially varying the gain of said first and second amplifying means; and
    means for combining the outputs of said first and second amplifying means.

5. Apparatus in accordance with claim 4 wherein said inverting amplifier comprises a third transistor having a base-emitter path electrically connected in shunt with the base-emitter path of said first transistor, and having a collector electrode electrically connected to said output terminal of said non-inverting amplifier.

6. Apparatus in accordance with claim 5 also including a fourth transistor having a base-emitter path electrically connected in shunt with the base-emitter path of said second transistor.

* * * * *